(12) United States Patent
Aoki et al.

(10) Patent No.: US 7,368,491 B2
(45) Date of Patent: May 6, 2008

(54) PHOSPHORUS-CONTAINING SILAZANE COMPOSITION, PHOSPHORUS-CONTAINING SILICEOUS FILM, PHOSPHORUS-CONTAINING SILICEOUS FILLER, METHOD FOR PRODUCING PHOSPHORUS-CONTAINING SILICEOUS FILM, AND SEMICONDUCTOR DEVICE

(75) Inventors: Tomoko Aoki, Tokyo (JP); Hiroyuki Aoki, Tokyo (JP)

(73) Assignee: AZ Electronic Materials USA Corp., Somerville, NJ (US)

( * ) Notice: Subject to any disclaimer, the term of this patent is extended or adjusted under 35 U.S.C. 154(b) by 51 days.

(21) Appl. No.: 10/564,336

(22) PCT Filed: Jul. 7, 2004

(86) PCT No.: PCT/JP2004/009649

§ 371 (c)(1),
(2), (4) Date: Jan. 11, 2006

(87) PCT Pub. No.: WO2005/007748

PCT Pub. Date: Jan. 27, 2005

(65) Prior Publication Data

US 2006/0217487 A1      Sep. 28, 2006

(30) Foreign Application Priority Data

Jul. 18, 2003      (JP)      ............... 2003-199363

(51) Int. Cl.
  C08J 3/00      (2006.01)
  C08K 5/49      (2006.01)
  C08L 83/00     (2006.01)
  D06M 15/643    (2006.01)
  H01L 29/00     (2006.01)

(52) U.S. Cl. ................. 524/115; 106/287.11; 427/96.2; 427/99.2; 427/99.4; 428/446; 524/588; 524/706; 524/858; 525/474; 525/477; 257/506

(58) Field of Classification Search ........... 106/287.11; 427/96.2, 99.2, 99.4; 428/446; 524/115, 524/588, 706, 858; 525/474, 477; 257/506
See application file for complete search history.

(56) References Cited

U.S. PATENT DOCUMENTS 5,459,114 A * 10/1995 Kaya et al. ................ 501/95.2
5,776,235 A    7/1998 Camilletti et al.
6,136,729 A   10/2000 Hopper et al.
6,479,405 B2  11/2002 Lee et al.
6,706,646 B1   3/2004 Lee et al.
2004/0028828 A1 2/2004 Aoki et al.

FOREIGN PATENT DOCUMENTS

| EP | 1 278 238 A1 | 1/2003 |
| EP | 1 640 423 A1 | 3/2006 |
| JP | 04-164923    | * 6/1992 |
| JP | 2001-319927  | 11/2001 |
| JP | 2002-367980  | 12/2002 |
| JP | 2004-331733  | 11/2004 |

OTHER PUBLICATIONS

Tokuyama, Takashi, "Electronics Technical Treatise [3]-MOS Devices", Aug. 10, 1979, pp. 59-64, Kogyo Chosakai Publishing Co., Ltd., Tokyo.
English Language Abstract of JP 2-12916.
English Language Abstract of JP 2-22475.
English Language Abstract of JP 4-164923.
English Language Abstract of JP 6-283507.
English Language Abstract of JP 8-176510.
English Language Abstract of JP 10-183063.
English Language Abstract of JP 11-105186.
English Language Abstract of JP 2001-308090.
English Language Abstract of JP 2001-319927.
English Language Abstract of JP 2002-367980.
English Language Abstract of JP 2002-75982.
English Language Abstract of JP 2004-331733.
Machine Language English Translation from JPO of JP 6-283507.
Machine Language English Translation from JPO of JP 8-176510.
Machine Language English Translation from JPO of JP 10-183063.
Machine Language English Translation from JPO of JP 11-105186.
Machine Language English Translation from JPO of JP 2001-308090.
Machine Language English Translation from JPO of JP 2002-75982.

* cited by examiner

*Primary Examiner*—Patrick Niland
(74) *Attorney, Agent, or Firm*—Alan P. Kass

(57) ABSTRACT

An objective of the present invention is to provide a phosphorous-containing siliceous material having a specific permittivity of not more than 3.5. The phosphorus-containing silazane composition according to the present invention is characterized by comprising a polyalkylsilazane and at least one phosphorus compound in an organic solvent. A phosphorus-containing siliceous film may be formed by coating the composition onto a substrate to form a film which is then prebaked at a temperature of 50 to 300° C. and is then baked in an inert atmosphere at a temperature of 300 to 700° C. The phosphorus compound according to the present invention is preferably a pentavalent phosphoric ester or phosphazene compound.

2 Claims, 1 Drawing Sheet

(BEFORE ETCHING)

(AFTER ETCHING 1)

(AFTER ETCHING 2)

PHOSPHORUS-CONTAINING SILAZANE COMPOSITION, PHOSPHORUS-CONTAINING SILICEOUS FILM, PHOSPHORUS-CONTAINING SILICEOUS FILLER, METHOD FOR PRODUCING PHOSPHORUS-CONTAINING SILICEOUS FILM, AND SEMICONDUCTOR DEVICE

This application is a United States National Stage Patent Application under 35 U.S.C. § 371 of International Patent Application No. PCT/JP2004/009649, filed Jul. 7, 2004, which claims priority to Japanese Patent Application No. 2003-199363, filed Jul. 18, 2003.

TECHNICAL FIELD

The present invention relates to a coating composition for providing a phosphorus-containing siliceous film, a phosphorus-containing siliceous film, a semiconductor device comprising the phosphorus-containing siliceous film, particularly a semiconductor device using the phosphorus-containing film as PMDs or IMDs, and a phosphorus-containing microporous filler.

BACKGROUND ART

The fabrication of electronic devices such as semiconductor devices involves the step of forming an insulating film called PMDs (premetal dielectrics) between transistor elements and bit lines, between transistor elements and capacitors, between bit lines and capacitors, or between capacitors and metallic wirings, the step of forming an insulating film called IMDs (intermetal dielectrics) between metallic wirings, or the step of embedding of isolation grooves. Siliceous materials are generally used in the formation or embedding of the insulating film. Methods for insulating film formation include CVD methods, sol-gel methods, and siloxane polymer solution coating methods.

An increase in integration density of electronic devices has led to an increasing tendency toward an increase in fineness of grooves on a substrate. For example, when fine grooves having a groove width of not more than 0.2 μm and a ratio of depth to width (hereinafter referred to also as "aspect ratio") of not less than 2 are embedded with a siliceous material by high-density plasma CVD which can form a good film quality at a relatively low temperature, due to conformal properties inherent in CVD, disadvantageously, voids are likely to be formed within the fine grooves. In order to avoid this unfavorable phenomenon, film formation by high-density plasma CVD and opening by etching should be repeated to form a void-free film. In this method, however, damage to the substrate is unavoidable such as a change in groove shape and material properties by high-density plasma atmosphere. Another method for insulating film formation is such that CVD is carried out under conditions of relatively high temperature and conventional plasma density and, if necessary, baking is carried out at a high temperature. This method, however, cannot meet a demand for a lowering in temperature of the process.

A method for solving such problems inherent in CVD is a sol-gel method or a siloxane polymer solution coating method in which a substrate having fine grooves is coated with a sol-gel liquid or a siloxane polymer solution, and the coating is dried to embed the fine grooves and is then heated for conversion to a siliceous material. In this method, for example, the solution of these materials generally has high viscosity, and, further, a dehydration-dealcohol reaction involved in silica conversion is indispensable. These make it difficult to fully embed the fine grooves with the solution and to embed the fine grooves in such a manner that the density is uniform from the film surface toward the bottom of the fine grooves.

In order to evenly embed the fine grooves, patent document 1 proposes a method in which a perhydropolysilazane solution having a weight average molecular weight of 3000 to 20000 in terms of polystyrene is coated onto a substrate having fine grooves, the coating is dried to embed the fine grooves with the perhydropolysilazane, and the perhydropolysilazane is then heated in a water vapor-containing atmosphere to convert the perhydropolysilazane to a siliceous material which has uniform density from the film surface toward the bottom of the fine grooves.

On the other hand, for the above-described PMDs and IMDs, an increase in speed of the electronic device and an increase in integration density have led to a demand for further lowered permittivity of the material. In particular, a permittivity of not more than 3.5 for PMD applications and a permittivity of not more than 2.5 for IMD applications are desired. The reason for this is that, for phosphoric acid-containing silica (PSG) or boric acid-phosphoric acid-containing silica (BPSG) PMDs formed by CVD, the permittivity is generally not less than 4.2 and in some cases not less than 5. In the perhydropolysilazane-derived siliceous film described in patent document 1, the permittivity is around 4, that is, a permittivity value of inorganic siliceous materials, and a low permittivity desired for PMD or IMD applications cannot be achieved.

Further, as described in nonpatent document 1, in PMDs, the presence of mobile ions, particularly $Na^+$ and $K^+$, even when the amount thereof is very small, results in unstable electrical characteristics and reliability. A conventional method for overcoming this drawback is to incorporate phosphoric acid for electrically trapping mobile ions. In general, however, the addition of phosphoric acid (pentavalent) to an inorganic polysilazane has a fear of producing monosilane ($SiH_4$) which causes firing. For this reason, in the method described in patent document 1, phosphoric acid (pentavalent) cannot be added to the perhydropolysilazane. Even when phosphoric acid can be added safely, since phosphoric acid is highly hygroscopic, it has been generally considered that the addition of phosphoric acid is disadvantageous for lowering the permittivity. Doping of phosphorus after conversion to a siliceous film through the utilization of an ion implantation method as described in patent document 3 and patent document 4 is also considered. In this method, however, doping cannot be uniformly carried out over the whole siliceous film. Further, in this method, an additional process is necessary after film formation. This is disadvantageous in throughput.

Patent document 1: Japanese Patent Laid-Open No. 308090/2000

Patent document 2: Japanese Patent Laid-Open No. 75982/2002

Patent document 3: Japanese Patent Laid-Open No. 319927/2001

Patent document 4: Japanese Patent Laid-Open No. 367980/2002

Nonpatent document 1: Tokuyama, "Erekutoronikusu Gijutsu Zensho (Complete Collection of Electronic Tech-

DISCLOSURE OF THE INVENTION

Problems to be Solved by the Invention

Accordingly, an object of the present invention is to simply provide a siliceous film which can realize uniform embedding of a siliceous material in fine grooves which could not have been carried out without difficulties by the above prior art techniques and can realize permittivity on a low level which could not hitherto been achieved as a phosphorus-containing insulating film for PMDs.

Means for Solving the Problems

The present inventors have made extensive and intensive studies with a view to solving the above problems of the prior art and, as a result, have completed the present invention by a combination of an organic polysilazane with a phosphorus compound. That is, the present invention is defined by the following matters.

[1] A phosphorus-containing silazane composition comprising a polyalkylsilazane and at least one phosphorus compound in an organic solvent.

[2] The composition according to [1], wherein said phosphorus compound is selected from the group consisting of phosphoric esters and phosphazene compounds.

[3] The composition according to [1], wherein said phosphorus compound is tris(trimethylsilyl)phosphate.

[4] The composition according to any one of [1] to [3], wherein said phosphorus compound is contained in an amount of 5 to 100% by mass based on said polyalkylsilazane.

[5] The composition according to any one of [1] to [4], wherein said polyalkylsilazane comprises repeating units represented by general formula (1) and at least one type of units represented by general formula (2) or general formula (3) and has a number average molecular weight of 100 to 50,000:

wherein $R^1$ and $R^2$ each independently represent a hydrogen atom or an alkyl group having 1 to 3 carbon atoms, excluding the case where $R^1$ and $R^2$ simultaneously represent a hydrogen atom;

[Chemical formula 1]

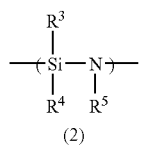

wherein $R^3$, $R^4$ and $R^5$ each independently represent a hydrogen atom or an alkyl group having 1 to 3 carbon atoms, excluding the case where $R^3$ and $R^4$ simultaneously represent a hydrogen atom;

[Chemical formula 2]

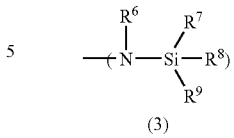

wherein $R^6$ to $R^9$ each independently represent a hydrogen atom or an alkyl group having 1 to 3 carbon atoms, excluding the case where all of $R^7$, $R^8$, and $R^9$ represent a hydrogen atom.

[6] The composition according to [5], wherein, in general formula (1), $R^1$ represents a methyl group and $R^2$ represents a hydrogen atom; in general formula (2), $R^3$ and $R^4$ represent a hydrogen atom or a methyl group and $R^5$ represents a hydrogen atom; and, in general formula (3), $R^7$, $R^8$ and $R^9$ represent a methyl group and $R^6$ represents a hydrogen atom.

[7] The composition according to [5] or [6], wherein said polyalkylsilazane comprises not less than 50% preferably not less than 80%, based on the total number of units represented by general formulae (1), (2) and (3), of repeating units represented by general formula (1).

[8] A phosphorus-containing siliceous film comprising 0.5 to 10 atomic % of phosphorus and being produced by baking a film of a composition according to any one of [1] to [7].

[9] The phosphorus-containing siliceous film according to [8], wherein the specific permittivity is not more than 3.5.

[10] A phosphorus-containing siliceous filler comprising 0.5 to 10 atomic % of phosphorus and being produced by filling a composition according to any one of [1] to [7] into grooves, in which the width of the deepest part is not more than 0.2 μm and the ratio of the depth to the width is not less than 2, and baking the film.

[11] A process for producing a phosphorus-containing siliceous film comprising coating a composition according to any one of [1] to [7] onto a substrate to form a film which is then prebaked at a temperature of 50 to 300° C. and is then baked in an inert atmosphere at a temperature of 300 to 700° C.

[12] A semiconductor device comprising a phosphorus-containing siliceous film according to [8] as an interlayer insulating film.

Effect of the Invention

The siliceous film provided by the present invention can realize a phosphorus-containing insulating film, particularly a phosphorus-containing insulating film that has a specific permittivity on a low level of not more than 3.5 which could not have hitherto been realized as PMD. Further, the siliceous film according to the present invention can be evenly embedded in fine grooves without forming voids and thus is particularly useful as an interlayer insulating film for semiconductor devices compatible with an advanced high-density integration process. Further, the method according to the present invention is also advantageous in that, in conversion to a siliceous film, there is no need to provide the step of humidification, and that the film can be formed at a lower temperature than that in the prior art techniques.

BRIEF DESCRIPTION OF THE DRAWINGS

FIG. 1 is a schematic cross-sectional view of a substrate with a siliceous film, illustrating an embedding property of the siliceous film according to the present invention.

FIG. 2 is a schematic cross-sectional view of a substrate with a siliceous film, illustrating an embedding property of the siliceous film according to the present invention.

FIG. 3 is a schematic perspective view of a substrate with a siliceous film, illustrating an embedding property of the siliceous film according to the present invention.

BEST MODE FOR CARRYING OUT THE INVENTION

Figure 1:
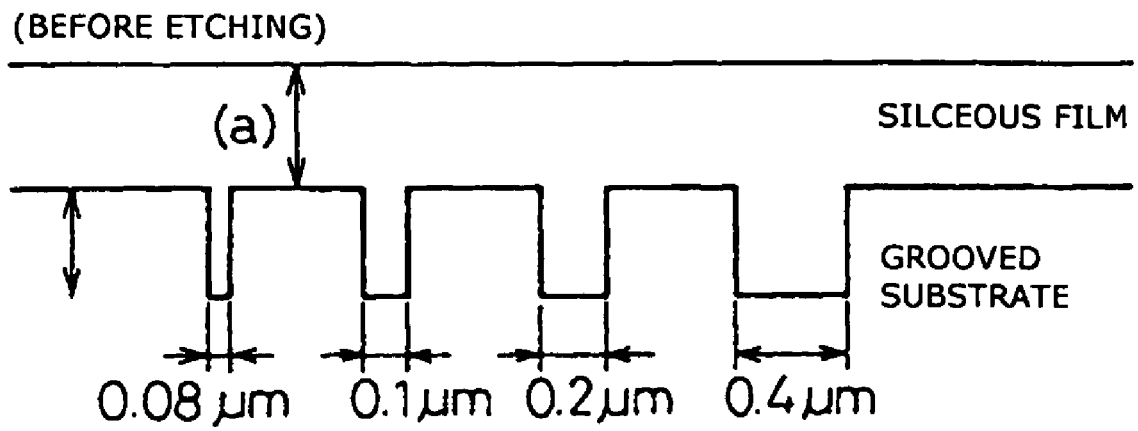
[FIG. 1]

The polyalkylsilazane according to the present invention preferably comprises repeating units represented by general formula (1) and units represented by general formula (2) and/or units represented by general formula (3) in its molecular chain and has a number average molecular weight of 100 to 50,000:

$$-(SiR^1(NR^2)_{1.5})- \qquad (1)$$

wherein $R^1$ and $R^2$ each independently represent a hydrogen atom or an alkyl group having 1 to 3 carbon atoms, excluding the case where $R^1$ and $R^2$ simultaneously represent a hydrogen atom;

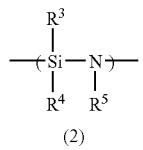

[Chemical formula 3]

(2)

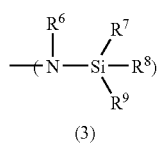

[Chemical formula 4]

(3)

wherein $R^3$, $R^4$ and $R^5$ each independently represent a hydrogen atom or an alkyl group having 1 to 3 carbon atoms, excluding the case where $R^3$ and $R^4$ simultaneously represent a hydrogen atom; and $R^6$ to $R^9$ each independently represent a hydrogen atom or an alkyl group having 1 to 3 carbon atoms, excluding the case where all of $R^7$, $R^8$, and $R^9$ represent a hydrogen atom. Methyl, ethyl, and propyl groups may be mentioned as the alkyl group. The methyl group is a particularly preferred alkyl group. A polyalkylsilazane containing an alkyl group having 4 or more carbon atoms is unfavorable because the resultant porous film is excessively soft. The polyalkylsilazane defined by general formula (2) is particularly preferably such that $R^3$ and $R^4$ represent a hydrogen atom or a methyl group, excluding the case where $R^1$ and $R^2$ simultaneously represent a hydrogen atom; and $R^5$ represents a hydrogen atom. The polyalkylsilazane defined by general formula (3) is particularly preferably such that $R^7$, $R^8$ and $R^9$ represent a methyl group and $R^6$ represents a hydrogen atom.

The polyalkylsilazane which is particularly preferred in the present invention comprises, in its molecular chain, repeating units represented by general formula (1) and has a number average molecular weight of 100 to 50,000. The reason for this is that, when the number average molecular weight is not more than 100, disadvantageously, the thin film is not formed (this is particularly significant when the coating is carried out by spin coating), while, when the number average molecular weight exceeds 50,000, the number of crosslinking groups is so large that gelation takes place.

In the present invention, a polyalkylsilazane comprising repeating units represented by general formula (1) and either general formula (2) or (3), or repeating units represented by general formula (1) and both general formulae (2) and (3) is particularly useful because gelation during storage of the composition can be prevented. In this case, not less than 50%, preferably not less than 80%, more preferably not less than 90%, of the total number of units represented by general formula (1) and either general formula (2) or (3), or the total number of units represented by general formula (1) and general formulae (2) and (3) is suitably accounted for by the number of repeating units represented by general formula (1). This is because, when the proportion is not more than 50%, unfavorable phenomena such as repelling or uneven coating are likely to occur during film formation.

These polyalkylsilazanes may be produced by using, in ammonolysis used in the synthesis of the conventional polysilazane which is self-evident to a person having ordinary skill in the art, as a starting material, an alkyltrichlorosilane ($R^1SiCl_3$) in the case of a polyalkylsilazane comprising repeating units represented by general formula (1); a dialkyldichlorosilane ($R^3R^4SiCl_2$) in the case of a polyalkylsilazane comprising repeating units represented by general formula (2); a trialkylchlorosilane ($R^6R^7R^8SiCl$) in the case of a polyalkylsilazane comprising units represented by general formula (3); or a mixture of the above chlorosilanes in the case of a polyalkylsilazane comprising both the above repeating units. The proportions of the individual units in the polyalkylsilazane are determined by the mixing ratio of these chlorosilanes.

Preferably, the polyalkylsilazane according to the present invention is dissolved in an active hydrogen-free inert organic solvent before use. Such organic solvents include: aromatic hydrocarbon solvents such as benzene, toluene, xylene, ethylbenzene, diethylbenzene, trimethylbenzene, and triethylbenzene; alicyclic hydrocarbon solvents such as cyclohexane, cyclohexene, decahydronaphthalene, ethylcyclohexane, methylcyclohexane, p-menthine, and dipentene (limonene); ether solvents such as dipropyl ether and dibutyl ether; ketone solvents such as methyl isobutyl ketone; and ester solvents such as propylene glycol monomethyl ether acetate.

The composition according to the present invention contains at least one phosphorus compound. As described above, the addition of phosphoric acid (valence of phosphorus atom: 5) to the inorganic polysilazane leads to a fear of producing monosilane ($SiH_4$) which causes firing, and, thus, there have been question about safety on a combination of the phosphorus compound with a polyalkylsilazane per se. Further, it has been considered that, even though the safety has been ensured, due to hygroscopicity of the phosphorus compound, the stabilization of electrical characteristics and low permittivity of PMD cannot be simultaneously satisfied by the addition of phosphorus. Contrary to the suggestion of the prior art technique, the present inventors have found that the addition of a phosphorus compound to a polyalkylsilazane, in which the alkyl group is attached to Si, does not result in the production of monosilane and that the stabilization of electrical characteristics and low permittivity of the siliceous film can be simultaneously satisfied by regulating conditions for baking of the composition. Specifically, despite the presence of phosphorus, the siliceous film provided by the present invention can stably maintain the specific permittivity on a low level of not more than 3.5 which is desired in PMD applications and has been unattainable by the prior art technique.

The phosphorus compound according to the present invention is preferably a phosphoric acid compound represented by general formula: $(RO)_3P=O$ in which the valence of the phosphorus atom is 5. In the above formula, Rs, which may be the same or different, each represent hydrogen, an ammonium group, an alkyl group having 1 to 5 carbon atoms, a substituted or unsubstituted aryl group having 6 to 10 carbon atoms, or a trisubstituted silyl group in which the substituents have 1 to 4 carbon atoms. Specific examples of pentavalent phosphoric acid compounds include, but are not limited to, phosphoric acid, ammonium phosphate, trimethyl phosphate, triethyl phosphate, tributyl phosphate, tricresyl phosphate, tris(trimethylsilyl) phosphate, and tris(2-chloroethyl) phosphate.

The phosphorus compound according to the present invention may be a phosphazene which is a compound having a structure represented by $-R^1{}_2P=N-$ wherein $R^1$s, which may be the same or different, each represent a halogen, an alkoxy group having 1 to 5 carbon atoms, or a substituted or unsubstituted phenoxy group having 6 to 10 carbon atoms. In particular, in the present invention, the use of a cyclic phosphazene or a phosphazene oligomer is preferred. Specific examples of such phosphazenes include hexachlorocyclophosphazen, propoxyphosphazene oligomers, and phenoxyphosphazene oligomers. In the present invention, oligomers produced using cyclic phosphazenes as a starting compound, for example, an oligomer produced by reacting hexachlorocyclophosphazene with hexamethyldisilazane, may also be used. They may also be used in a combination of two or more of them.

Phosphorus compounds in which the valence of the phosphorus atom is 3 including trialkyl phosphite may also be used in the present invention. In the present invention, the use of the above phosphoric acid compound is preferred from the viewpoints of enhancing the residual content in a siliceous film produced by baking the above composition and satisfactorily utilizing catalytic action that contributes to process simplification which will be described later.

The phosphorus compound according to the present invention is contained in the composition in such an amount that is required in attaining the effect of electrically trapping mobile ions such as $Na^+$ and $K^+$ (gettering effect) in the baked film of the composition. In order to attain this gettering effect, at least 0.5 atomic %, preferably 2 atomic %, more preferably 4 atomic %, of phosphorus (P) should be present in the baked film. On the other hand, when the amount of the phosphorus compound according to the present invention is excessively large, due to its hygroscopicity, the permittivity of the baked film is increased. Accordingly, the content of the phosphorus (P) in the baked film should be limited to not more than 10 atomic %, preferably not more than 8 atomic %, based on the total number of atoms.

In order to realize the above content of phosphorus in the baked film, the content of the phosphorus compound in the phosphorus-containing silazane composition according to the present invention is generally in the range of 5 to 100% by mass, preferably 10 to 100% by mass, based on the polyalkylsilazane, although the content varies depending upon the composition of the compound.

In mixing the phosphorus compounds according to the present invention, they may be added directly to the polyalkylsilazane solution, or alternatively may be added as a solution thereof dissolved in an organic solvent to the polyalkylsilazane solution. In the latter case, the organic solvent may be the same as used in the preparation of the polyalkylsilazane solution.

If desired, a porous baked siliceous film can be formed by adding a polyacrylic ester or a polymethacrylic ester described in patent document 2 to the phosphorus-containing silazane composition according to the present invention, or by adding at least one organic resin component selected from the group consisting of homo- and co-polymers of acrylic esters and methacrylic esters, group —COOH and/or group —OH being contained in at least a part of side groups contained in at least one type of the organic resin component, as described in Japanese Patent Application No. 126381/2003. The siliceous film which has rendered porous has further lowered permittivity and thus is particularly useful, for example, for IMD applications where a low permittivity of not more than 2.5 is required.

Polyacrylic esters or polymethacrylic esters described in patent document 2 include polymethyl acrylate, polyethyl acrylate, polybutyl acrylate, polymethyl methacrylate, polyethyl methacrylate, polybutyl methacrylate, polyisobutyl methacrylate, and their block copolymers and other copolymers. The polyacrylic ester or the polymethacrylic ester has a number average molecular weight of 1,000 to 800,000, preferably 10,000 to 600,000, most preferably 50,000 to 300,000.

Further, organic resin components described in Japanese Patent Application No. 126381/2003 include any combination of the following materials: homopolymers of acrylic esters, for example, polymethyl acrylate and polyethyl acrylate; homopolymers of methacrylic esters, for example, polymethyl methacrylate and polyethyl methacrylate; copolymers of acrylic esters, for example, poly(methyl acrylate-co-ethyl acrylate); copolymers of methacrylic esters, for example, poly(methyl methacrylate-co-ethyl methacrylate); and copolymers of acrylic esters with methacrylic esters, for example, poly(methyl acrylate-co-ethyl metharylate).

When the organic resin component is a copolymer, the sequence of monomers is not limited, and random copolymers, block copolymers and copolymers of other desired monomer sequence may be used.

Monomers constituting homo- and copolymers of acrylic esters and methacrylic esters include, but are not limited to, methyl methacrylate, ethyl methacrylate, n-butyl methacrylate, i-butyl methacrylate, t-butyl methacrylate, methyl acrylate, ethyl acrylate, n-butyl acrylate, i-butyl acrylate, and t-butyl acrylate. In particular, methyl methacrylate, n-butyl methacrylate, n-butyl acrylate and i-butyl acrylate are more preferred from the viewpoint of compatilbility with polyacrylsilazane.

Group —COOH and/or group —OH are contained in at least a part of side groups contained in at least one type of the organic resin component. Group —COOH and/or group —OH may be previously contained in monomers for constituting the organic resin component. Monomers containing group —COOH or group —OH include, but are not limited to, acrylic acid, methacrylic acid, 2-hydroxyethyl methacrylate, 2-hydroxypropyl methacrylate, and 2-hydroxybutyl methacrylate. In particular, acrylic acid, methacrylic acid, 2-hydroxyethyl methacrylate are preferred from the viewpoint of easiness on a reaction with polyacrylsilazane.

Alternatively, group —COOH and/or group —OH may be introduced into side chains of homopolymers or copolymers later. For example, group —COOH may be introduced into side chains by at least partially hydrolyzing a polymethacrylic ester.

When two or more organic resin components are present, the presence of group —COOH and/or group —OH in at least one type of the organic resin components suffices for contemplated results. Accordingly, a mixture of an organic resin containing neither group —COOH nor group —OH, for example, a polyacrylic ester, with an organic resin containing group —COOH and/or group —OH, for example, poly(methacrylic ester-co-methacrylic acid), may be used as the organic resin component.

The amount of the above polyacrylic ester or polymethacrylic ester or organic resin component added is 5 to 150% by mass based on the polyalkylsilazane used. When the amount of the organic resin component added is less than 5% by mass, the pore formation in the film is unsatisfactory, while, when the addition amount exceeds 150% by mass, defects such as voids or cracks occur in the film, resulting in lowered film strength. Therefore, both the above cases are unfavorable. The amount of the organic resin component added is preferably 10 to 120% by mass, and, in particular, the addition of the organic resin component in an amount of 20 to 100% by mass provides optimal results.

When the organic resin component is used, the content of group —COOH and/or group —OH in the phosphorous-containing silazane composition is preferably 0.01 to 50 mol %, particularly preferably 0.1 to 30 mol %, based on the total number of monomers constituting the organic resin component.

When the organic resin component is used, the unit containing group —COOH or group —OH contained in the above mixture or polymer, together with the polyalkylsilazane chain, forms a crosslinking bond through the group —COOH or group —OH. Therefore, the composition containing these units and the polyalkylsilazne as the base material constitute a reaction product having a bond rather than a mere mixture. In this case, when the amount of group —COOH and/or group —OH exceeds 50% by mole, crosslinking with the polyalkylsilazane excessively proceeds and, thus, gelation easily occurs. On the other hand, when the amount of group —COOH and/or group —OH is less than 0.01% by mole, the degree of crosslinking bonding is excessively low and the desired effect cannot be attained.

Further, when the organic resin component is used, the number average molecular weight of the organic resin component is 1,000 to 800,000. When the number average molecular weight is less than 1,000, the organic resin component is sublimated at a very low temperature during the formation of a baked film and, consequently, no porous film is formed. On the other hand, when the number average molecular weight exceeds 800,000, the pore diameter is increased and this increase in pore diameter is causative of voids, leading to lowered film strength. Therefore, both the above cases are unfavorable. The molecular weight of the organic resin component is preferably in the range of 1,000 to 600,000, and, in particular, a molecular weight of 10,000 to 200,000 provides the optimal results.

In the case of the group —COOH— and/or group —OH-containing organic resin component, attachment of this component to the polyalkylsilazane in the base material through the group —COOH and/or group —OH restricts the separation of the organic resin component, and, as a result, a composition free from macro phase separation (that is, the phase separation stays on the level of micro phase separation) can be provided.

In mixing the polyacrylic ester or polymethacrylic ester or the organic resin component, in general, a method may be adopted in which they are dissolved in an organic solvent to prepare a solution, the solution is added to a polyalkylsilazane solution, and the mixture is stirred. In this case, the same organic solvent as used in the preparation of the polyalkylsilazane solution may be used. Specifically, the above active hydrogen-free inert organic solvent may be used as the organic solvent for dissolution.

In the dissolution in this organic solvent, the concentration of the organic resin component may be brought to a range of 5 to 80% by mass, preferably 10 to 40% by mass.

After the addition thereof, the mixture may be physically stirred for 1 to 24 hr to give a homogeneous reaction solution in which a crosslinking bond has been formed. Further, ultrasonic dispersion treatment on a hot-water bath of 30 to 80° C. for about 5 to 90 min is more advantageous from the viewpoint of accelerating the reaction.

In this connection, it should be noted that the organic resin component as such may also be added to, dissolved in and reacted with the polyalkylsilazane solution.

The phosphorus-containing silazane composition as the reaction product thus obtained may be used, either as such or after concentration regulation, as a coating composition for coating onto the surface of a substrate. The coating composition may be coated onto the surface of the substrate by conventional methods, for example, spin coating, dip coating, spray coating, or transfer.

The coated film formed on the surface of the substrate is baked so that the alkyl group in the polyalkylsilazane remain unremoved. To this end, the baking is generally carried out in an inert atmosphere, for example, nitrogen gas, argon gas, or helium gas. Further, preferably, the baking is carried out in a dry atmosphere from the viewpoint of preventing the elimination of carbon contained in the polyalkylsilazane. Baking in the dry atmosphere is advantageous in that damage to the electronic device structure can be reduced.

The baking temperature is 50 to 600° C., preferably 300 to 500° C., and the baking time is 1 min to 1 hr. It is a matter of course that baking can be carried out in the atmosphere so far as the alkyl group remains unremoved in the baked film.

In the phosphorus-containing silazane composition according to the present invention, the phosphorus compound functions as a moisture absorption acceleration catalyst. Therefore, when the step of coating is carried out in a conventional clean room atmosphere, moisture necessary for conversion to a siliceous material (replacement of nitrogen of silazane by oxygen) is introduced into the coating film. Accordingly, a siliceous film having good quality can be formed without separately providing the "step of moisture absorption" in which the coating film is then allowed to stand in the atmosphere or is subjected to hygroscopic treatment under humidified conditions.

If desired, prior to the step of baking, in order to remove the solvent contained in the phosphorous-containing polyalkyl silazane coating film and to scatter a low-molecular weight component contained in the coating film, the coating film may be heat treated (prebaked). When the heat treatment is carried out for solvent removal purposes, the temperature in the heat treatment may be about 50 to 200° C., while, when the heat treatment is carried out for low-molecular weight component removal purposes, the temperature in the heat treatment may be about 200 to 300° C. The heat treatment time may be about 1 to 10 min although it varies depending upon the treatment temperature. In a preferred embodiment, prior to the step of baking, the coating film is heated at about 150° C. for 3 min to remove the solvent and then heated at about 250° C. for 3 min to remove the low-molecular weight component. The heat treatment can further improve the quality of the resultant siliceous film.

In the above step of baking, among SiH, SiR (R: alkyl group) and SiN bonds in the polyalkylsilazane, only the SiN bond is oxidized and is consequently converted to SiO bond, whereby a siliceous film containing SiH and SiR bonds remaining unoxidized is formed. Thus, SiO bond formed by selective oxidation of SiN bond and the unoxidized SiH and SiR bonds can be allowed to exist in the formed siliceous film, whereby a low-density siliceous film can be provided. In general, the permittivity of the siliceous film lowers with lowering of the density of the film. On the other hand, when the density of the film is lowered to render the film porous, water as a highly dielectric material is adsorbed into the inside of the film, posing a problem that, when the siliceous film is allowed to stand in the air, the permittivity of the film is increased. On the other hand, in the case of the siliceous film according to the present invention containing SiH or SiR bond, since these bonds are water repellent, the adsorption of water can be prevented despite the low density of the film. Therefore, the siliceous film according to the present invention has a great advantage that, even when the siliceous film is allowed to stand in the water vapor-containing air, the permittivity of the film is not substantially increased. Further, the siliceous film according to the present invention has low density and thus is advantageous in that the internal stress of the film is small and cracking is less likely to occur.

The phosphorus-containing silazane composition according to the present invention is particularly suitable for even embedding in fine grooves in a substrate with fine grooves. Specifically, the phosphorus-containing silazane composition according to the present invention can be embedded in grooves in which the width of the deepest part is not more than 0.2 µm and the ratio of the depth to the width is not less than 2 without significantly lowering the density of the siliceous material within the grooves as compared with the exterior part of the grooves. An improvement in homogeneity of the density of the siliceous material within the fine grooves can facilitate the subsequent formation of through-holes. Such applications include, for example, undercoating of liquid crystal glass (such as Na passivation film), overcoating of liquid crystal color filters (insulation flattening film), gas barrier of film liquid crystal, hardcoating of substrates (metals and glass), heat resistant and antioxidation coating, antifouling coating, water-repellent coating, hydrophilic coating, ultraviolet cut coating for glass and plastics, and colored coating.

When the phosphorus-containing silazane composition according to the present invention contains the above polyacrylic ester or polymethacrylic ester, upon the baking of the coating film, micropores having a diameter of 5 to 30 nm are formed within the siliceous film as a result of sublimation of the polymer. By virtue of the presence of the pores, the density of the siliceous film is lowered and, consequently, the specific permittivity of the siliceous film is further lowered. Further, when the phosphorus-containing silazane composition according to the present invention contains the above organic resin component, upon the baking of the coating film, micropores mainly having a diameter of 0.5 to 3 nm are formed within the siliceous film as a result of sublimation of the organic resin component in the coating film. By virtue of the presence of the pores, the density of the siliceous film is lowered and, consequently, the specific permittivity of the siliceous film is further lowered. One of the reasons why such micropores are formed is believed to reside in that, in addition to very good compatibility of the polyalkylsilazane with the organic resin component, in the case of the organic resin component, since a crosslinking bond is present between the polyalkylsilazane and the organic resin component containing group —COOH and/or group —OH, macrophase separation does not occur until the time immediately before the sublimation of the organic resin component.

In particular, in the porous siliceous film formed using the organic resin component, since very fine pores can be formed, the mechanical strength is excellent. It should be particularly noted that the porous siliceous film has significantly high mechanical strength when the fact that the material is porous is taken into consideration, that is, has a mechanical strength of not less than 3 GPa and in some cases not less than 5 GPa in terms of modulus of elasticity as measured by a nanoindentation method. Accordingly, the porous siliceous film has both mechanical strength high enough to withstand the step of removing the wiring material by CMP and resistance to various chemicals and thus can be used as an interlayer insulation film suitable for advanced high integration processes including a damascene process.

Further, in the siliceous film according to the present invention, the water repellent group in the polyalkylsilazane as the matrix component remains unremoved after baking in a satisfactory amount and, hence, when it is allowed to stand in the water vapor-containing air, the specific permittivity is not substantially increased due to the suppression of hygroscopicity of the phosphorus compound. Thus, according to the present invention, despite the fact that phosphorus is contained, a porous siliceous film can be provided in which, by virtue of lowered density and water repellency derived from bonding components (SiH, SiR) of the siliceous film and, in the case of the porous film, further lowered density of the whole film derived from the pores in cooperation with each other, a very low level of specific permittivity of not more than 2.5 which is desired in IMD applications can be stably maintained.

Regarding other properties of the porous siliceous film according to the present invention, the density is 0.5 to 1.6 $g/cm^3$, preferably 0.8 to 1.4 $g/cm^3$, and the crack limit film thickness is not less than 1.0 µm, preferably not less than 5 µm, and the internal stress is not more than 80 MPa, preferably not more than 50 MPa. The content of Si present as SiH or SiR (R: alkyl group) bond contained in the siliceous film is 10 to 100 atomic %, preferably 25 to 75 atomic %, based on the number of Si atoms contained in the film. The content of Si present as SiN bond is not more than 5 atomic %. The thickness of the porous siliceous film obtained after baking may vary depending upon applications of the surface of the substrate. In general, however, the thickness of the porous siliceous film is 0.01 to 5 µm, preferably 0.1 to 2 µm. In particular, when the porous siliceous film is used as an interlayer insulation film for semiconductors, the thickness is 0.1 to 2 µm.

The embodiment of the present invention will be described in more detail with reference to the following Examples. In the following Examples, properties of siliceous films were evaluated by the following methods.

(Film thickness and refractive index) The composition solution was spin coated onto a silicon wafer having a diameter of 4 in. (10.16 cm) and a thickness of 0.5 mm to form a film which was then converted to a siliceous film by the method according to Examples and Comparative Examples, and measurement was carried out with a spectroscopic ellipsometer (M-44, manufactured by J. A. Woollam) for 39 points, and the measured data were averaged to determine a measured value.

(Specific permittivity) CV measurement was carried out at a frequency of 100 kHz with a mercury CV/IV measuring device (SSM495) manufactured by Solid State Measurements. The specific permittivity was calculated by the following equation based on the measured capacitance with a software attached to the device. The film thickness used in the calculation was measured with a spectroscopic ellipsometer (M-44, manufactured by J. A. Woollam).

Specific permittivity=(capacitance [pF])×(film thickness [μm])/35.4

The value of the specific permittivity is a 17-point average value.

(Film density) The weight of a silicon wafer having a diameter of 4 in. (10.16 cm) and a thickness of 0.5 mm was measured with an electrobalance. The composition solution was spin coated onto the silicon wafer to form a film which was then converted to a siliceous film by the method according to Examples and Comparative Examples. The weight of the silicon wafer with the film was then again measured with an electrobalance. The difference in weight between the measured weight of the wafer and the measured weight of the wafer with the film was regarded as the weight of the film. The film thickness was measured with a spectroscopic ellipsometer (M-44, manufactured by J. A. Woollam), the same device as used in the evaluation of the specific permittivity. The film density was calculated by the following equation.

Film density [g/cm$^3$]=(film weight [g]/film thickness [μm])/0.008

(Evaluation on resistance to various aqueous washing solutions) Resistance of the siliceous material in the deepest part of grooves (the inside of grooves) and the film surface to aqueous washing solutions were evaluated as follows. A polymer solution to be evaluated was filtered through a PTFE filter with a filtration accuracy of 0.1 μm. The polymer solution (2 ml) was dropped on a silicon wafer that had a diameter of 101.6 mm (4 in.), had a surface covered with a 0.05 μm-thick $Si_3N_4$ thin film, and had on its surface grooves which were rectangular in its longitudinal section and had a given depth of 0.4 μm and four levels of width of 0.08 μm, 0.1 μm, 0.2 μm and 0.4 μm (aspect ratios: respectively 5.0, 4.0, 2.0, and 1.0) (a substrate with grooves; see FIG. 1), for spin coating under conditions of rotating speed 2000 rpm and retention time 20 sec. Next, the coated silicon wafer were heated by various methods, which will be described later, to form a siliceous film. The substrate with a siliceous film thus obtained was cut in a direction at a right angle to the longitudinal direction of the grooves, and the sectional groove part was observed under a scanning electron microscope (SEM) (MODEL S-5000, manufactured by Hitachi, Ltd.) at a magnification of 150000 times in a direction perpendicular to the section to measure the length (a) before etching shown in FIG. 1.

Figure 2:
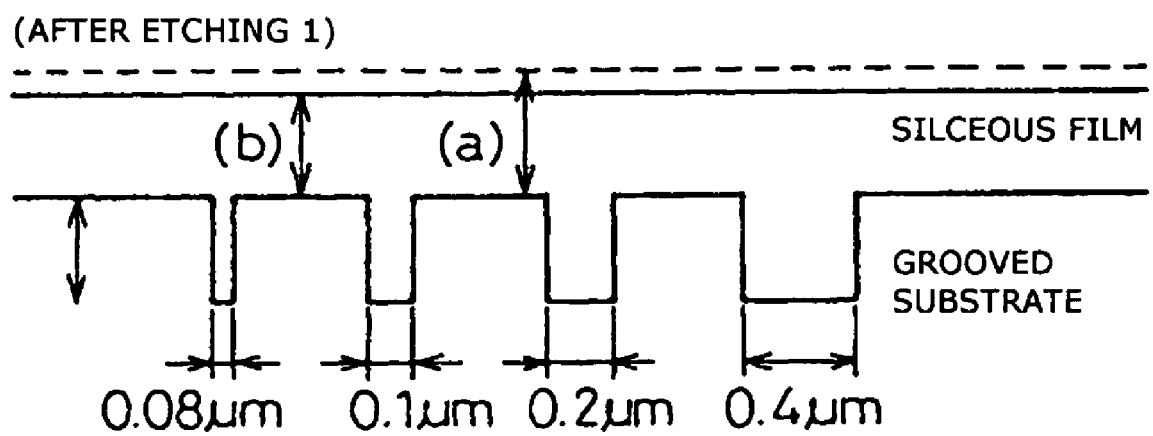
[FIG. 2]
Figure 3:
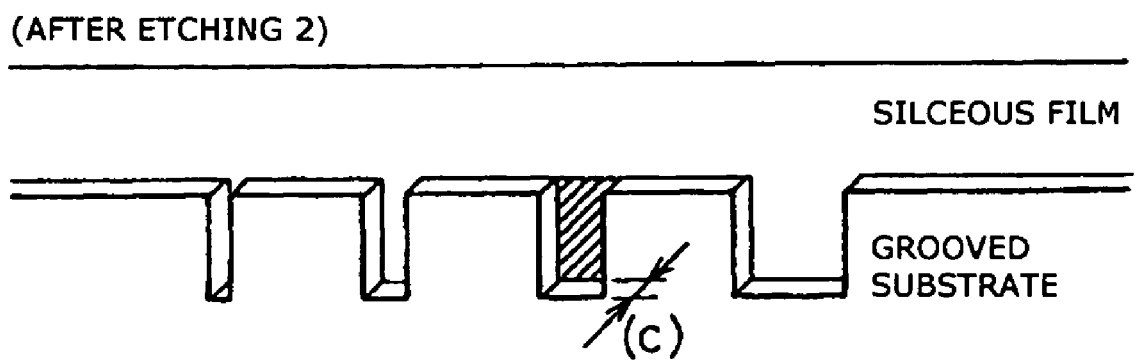
[FIG. 3]

Next, the substrate with a siliceous film cut at a right angle to the longitudinal direction of the grooves was immersed in (1) an aqueous solution containing 0.5% by mass of hydrofluoric acid and 40% by mass of ammonium fluoride at 20° C. for one min, and was immersed in (2) ACT-970 (manufactured by Ashland Chemical), EKC265 and EKC640 (manufactured by EKC), which are widely used as an etching residue peeling liquid, respectively at 75° C. for 20 min, at 75° C. for 30 min, and at 23° C. for 20 min, followed by thorough washing with pure water and drying. In the same manner as described above, the sectional groove part was observed under SEM at a magnification of 150000 times first in a direction perpendicular to the section to measure the length (b) after etching shown in FIG. 2. Subsequently, the sectional groove part in its deepest part was observed under SEM at a magnification of 300000 times from an elevation angle of 40 degrees above in a direction perpendicular to the section and was photographed. Based on the length on the photograph, the length (c) after etching shown in FIG. 3 was calculated by a triangular method. Since the length (c) after etching of the deepest part of the groove varies depending upon the groove width (aspect ratio), measurement was made for grooves of four width levels.

(Elementary quantitative analysis by XPS) The elementary analysis of the film in the direction of the depth was carried out with an xps device (MODEL 5600ci, manufactured by Physical Electronics).

REFERENCE EXAMPLE 1

Synthesis of polymethylsilazane (1)

A stainless steel tank for raw material supply was mounted on a stainless steel tank reactor having an internal volume of 5 L. The air within the reactor was replaced by dry nitrogen. Thereafter, 780 g of methyltrichlorosilane was placed in the stainless steel tank for raw material supply and was pressure fed and introduced into the reaction tank by nitrogen. Next, a raw material supply tank containing pyridine was connected to the reactor, and 4 kg of pyridine was pressure fed by nitrogen in the same manner as described above. The pressure of the reactor was regulated to 1.0 kg/cm$^2$, and the temperature was regulated so that the temperature of the mixed solution within the reactor was brought to −4° C. Ammonia was blown into the mixed solution with stirring, and, when the pressure of the reactor reached 2.0 kg/cm$^2$, the supply of ammonia was stopped. An exhaust line was opened to lower the pressure of the reactor, and, subsequently, dry nitrogen was blown into the liquid layer for one hr to remove excess ammonia. The product thus obtained was filtered under pressure through a pressure filter in a dry nitrogen atmosphere to give 3200 mL of a filtrate. Pyridine was removed by evaporation by means of an evaporator to give about 340 g of polymethylsilazane. The number average molecular weight of the polymethylsilazane thus obtained was measured by GPC (developing liquid: $CHCl_3$) and was found to be 1800 in terms of polystyrene. In the IR (infrared absorption) spectrum of the polymethylsilazane, absorption attributable to N—H was observed at wavenumbers (cm$^{-1}$) 3350 and around 1200; absorption attributable to Si—C was observed at 2900 and 1250; and absorption attributable to Si—N—Si was observed at 1020 to 820.

REFERENCE EXAMPLE 2

Synthesis of polymethylsilazane (2)

Polymethylsilazane (about 370 g) was synthesized in the same manner as in Reference Example 1, except that, instead of 780 g of methyltrichlorosilane, a mixture of 720 g of methyltrichlorosilane (about 4.8 mol) with 65 g of dimethyldichlorosilane (about 0.5 mol) (methyltrichlorosilane dimethyldichlorosilane=95:10 (mol/mol)) was used as the starting material. The number average molecular weight of the polymethylsilazane thus obtained was measured by GPC (developing liquid: $CHCl_3$) and was found to be 1400 in terms of polystyrene. In the IR (infrared absorption) spectrum of the polymethylsilazane, absorption attributable to N—H was observed at wavenumbers ($cm^{-1}$) 3350 and around 1200; absorption attributable to Si—C was observed at 2900 and 1250; and absorption attributable to Si—N—Si was observed at 1020 to 820.

EXAMPLE 1

Tris(trimethylsilyl) phosphate (4.8 g) was added to 80 g of a 15% propylene glycol monomethyl ether acetate (hereinafter referred to as "PGMEA") solution of polymethylsilazane synthesized in Reference Example 1 with thorough stirring. Subsequently, the solution was filtered through a PTFE Syringe Filter with a filtration accuracy of 0.2 μm, manufactured by Advantec Toyo Kaisha Ltd. The filtrate was spin coated onto a silicon wafer having a diameter of 10.2 cm (4 in.) and a thickness of 0.5 mm (2000 rpm, 30 sec). Subsequently, the silicon wafer was heated in the atmosphere on a hot plate of 150° C. and then 250° C. each for 3 min. This film was baked in a dry nitrogen atmosphere at 500° C. for 30 min. For the IR (infrared absorption) spectrum of the product, absorption attributable to Si—O at wavenumbers ($cm^{-1}$) 1100 and 450, absorption attributable to Si—C at wavenumbers ($cm^{-1}$) 1270 and 770, and absorption attributable to C—H at wavenumber ($cm^{-1}$) 2970 were mainly observed, while absorption attributable to N—H at wavenumbers ($cm^{-1}$) 3350 and 1200 disappeared. A peak attribtuatble to P=O at a wavenumber ($cm^{-1}$) around 1100 was hidden in the absorption attributable to Si—O, and a shoulder peak was slightly observed on the high wavenumber side.

The film thus obtained was evaluated. As a result, it was found that the specific permittivity was 3.20 and the density was 1.3 $g/cm^3$. The film was allowed to stand in the atmosphere under conditions of temperature 23° C. and relative humidity 50% for one week. Thereafter, the specific permittivity was again measured and was found to be 3.30. That is, the specific permittivity was increased only by 0.1.

The distribution of phosphorus element in this film was investigated by XPS measurement. As a result, the presence of about 4 atomic % of P atom was observed evenly from the surface to the lowermost face (face of contact with Si substrate) in a direction of depth of the film thickness. Accordingly, it can be said that the siliceous film produced in this Example can exhibit the desired gettering effect.

Next, in the same manner as described in the section of (Evaluation on resistance to various aqueous washing solutions), the above filtrate was coated on the substrate having grooves on its surface, and the coating was heated by the above method to form a siliceous film. This siliceous film was observed under SEM by the method as described in the same section. As a result, it was found that the baked film was fully embedded in the inside of the grooves, and voids and the like were not observed. Further, neither void nor separation was observed between the film and the liner. The film thickness etched by aqueous washing solutions (1) and (2) {(a-b) and c} was measured and calculated. As a result, it was found that, regarding aqueous washing solution (1), for all the groove widths, the etched film thickness was substantially 0 angstrom, and, regarding aqueous washing solution (2), the etched film thickness was 0 to 20 angstroms, that is, the film was not substantially etched.

EXAMPLE 2

A solution of 15 g of a propoxyphosphazene oligomer (molecular weight 1500) dissolved in 35 g of PGMEA was added to 50 g of a 30% PGMEA solution of the polymethylsilazane synthesized in Reference Example 1, and the mixture was thoroughly stirred. Subsequently, the solution was filtered through a PTFE Syringe Filter with a filtration accuracy of 0.2 μm, manufactured by Advantec Toyo Kaisha Ltd. The filtrate was spin coated onto a silicon wafer having a diameter of 10.2 cm (4 in.) and a thickness of 0.5 mm (2000 rpm, 30 sec). Subsequently, the silicon wafer was heated in the atmosphere on a hot plate of 150° C. and then 250° C. each for 3 min. This film was baked in a dry nitrogen atmosphere at 500° C. for 30 min. For the IR (infrared absorption) spectrum of the product, absorption attributable to Si—O at wavenumbers ($cm^{-1}$) 1120 and 440, absorption attributable to Si—C at wavenumbers ($cm^{-1}$) 1270 and 770, and absorption attributable to C—H at wavenumber ($cm^{-1}$) 2950 were mainly observed, while absorption attributable to N—H at wavenumbers ($cm^{-1}$) 3350 and 1200 disappeared. A peak attributable to P=O at a wavenumber ($cm^{-1}$) around 1120 was hidden in the absorption attributable to Si—O, and a shoulder peak was slightly observed on the high wavenumber side.

The film thus obtained was evaluated. As a result, it was found that the specific permittivity was 3.35 and the density was 1.3 $g/cm^3$. The film was allowed to stand in the atmosphere under conditions of temperature 23° C. and relative humidity 50% for one week. Thereafter, the specific permittivity was again measured and was found to be 3.50. That is, the specific permittivity was increased only by 0.15.

The distribution of phosphorus element in this film was investigated by XPS measurement. As a result, the presence of about 3 atomic % of P atom was observed evenly from the surface to the lowermost face (face of contact with Si substrate) in a direction of depth of the film thickness. Accordingly, it can be said that the siliceous film produced in this Example can exhibit the desired gettering effect.

Next, in the same manner as described in the section of (Evaluation on resistance to various aqueous washing solutions), the above filtrate was coated on the substrate having grooves on its surface, and the coating was heated by the above method to form a siliceous film. This siliceous film was observed under SEM by the method as described in the same section. As a result, it was found that the baked film was fully embedded in the inside of the grooves, and voids and the like were not observed. Further, neither void nor separation was observed between the film and the liner. The film thickness etched by aqueous washing solutions (1) and (2) {(a-b) and c} was measured and calculated. As a result, it was found that, regarding aqueous washing solution (1), for all the groove widths, the etched film thickness was substantially 0 angstrom, and, regarding aqueous washing solution (2), the etched film thickness was 0 to 20 angstroms, that is, the film was not substantially etched.

EXAMPLE 3

Tris(trimethylsilyl) phosphate (15 g) was added to 100 g of a 12% PGMEA solution of the polymethylsilazane synthesized in Reference Example 1, and the mixture was thoroughly stirred. Further, a solution of 4 g of poly(n-butyl methacrylate (68 mol %)-co-methyl methacrylate (30 mol %)-co-methacrylic acid (2 mol %) having a molecular weight of above 19,000 fully dissolved in 33 g of PGMEA was mixed in 50 g of this solution, and the mixture was thoroughly stirred. Subsequently, the solution was filtered through a PTFE Syringe Filter with a filtration accuracy of 0.2 μm, manufactured by Advantec Toyo Kaisha Ltd. The filtrate was spin coated onto a silicon wafer having a diameter of 10.2 cm (4 in.) and a thickness of 0.5 mm (2000 rpm, 30 sec). Subsequently, the silicon wafer was heated in the atmosphere on a hot plate of 150° C. and then 280° C. each for 3 min. This film was baked in a dry nitrogen atmosphere at 400° C. for 30 min. For the IR (infrared absorption) spectrum of the product, absorption attributable to Si—O at wavenumbers (cm$^{-1}$) 1100 and 450, absorption attributable to Si—C at wavenumbers (cm$^{-1}$) 1270 and 770, and absorption attributable to C—H at wavenumber (cm$^{-1}$) 2970 were mainly observed, while absorption attributable to N—H at wavenumbers (cm$^{-1}$) 3350 and 1200 and absorption attributable to poly(n-butyl methacrylate-co-methyl methacrylate-co-methacrylic acid) disappeared. A peak attributable to P=O at a wavenumber (cm$^{-1}$) around 1100 was hidden in the absorption attributable to Si—O, and a shoulder peak was slightly observed on the high wavenumber side.

The film thus obtained was evaluated. As a result, it was found that the specific permittivity was 2.24 and the density was 1.0 g/cm$^3$. The film was allowed to stand in the atmosphere under conditions of temperature 23° C. and relative humidity 50% for one week. Thereafter, the specific permittivity was again measured and was found to be 2.30. That is, the specific permittivity was increased only by 0.06.

The distribution of phosphorus element in this film was investigated by XPS measurement. As a result, the presence of about 4 atomic % of P atom was observed evenly from the surface to the lowermost face (face of contact with Si substrate) in a direction of depth of the film thickness. Accordingly, it can be said that the siliceous film produced in this Example can exhibit the desired gettering effect.

Next, in the same manner as described in the section of (Evaluation on resistance to various aqueous washing solutions), the above filtrate was coated on the substrate having grooves on its surface, and the coating was heated by the above method to form a siliceous film. This siliceous film was observed under SEM by the method as described in the same section. As a result, it was found that the baked film was fully embedded in the inside of the grooves, and voids and the like were not observed. Further, neither void nor separation was observed between the film and the liner.

COMPARATIVE EXAMPLE 1

A solution was prepared in the same manner as in Example 1, except that tris(trimethylsilyl) phosphate was not added. The filtration of the solution, coating of the filtrate, and the heat treatment of the coating were carried out in the same manner as in Example 1, except that, after coating, the step of subjecting the coating film to moisture absorption by a humidifier in a humidified atmosphere under conditions of 50° C. and 80% RH for one hr was additionally provided. Thereafter, the step of baking was carried out in the same manner as in Example 1 to prepare a baked siliceous film.

The film thus obtained was evaluated. As a result, it was found that the specific permittivity was 2.90 and the density was 1.3 g/cm$^3$. The film was allowed to stand in the atmosphere under conditions of temperature 23° C. and relative humidity 50% for one week. Thereafter, the specific permittivity was again measured and was found to be 2.95. That is, the specific permittivity was increased only by 0.05.

Next, in the same manner as described in the section of (Evaluation on resistance to various aqueous washing solutions), the above filtrate was coated on the substrate having grooves on its surface, and the coating was heated by the above method to form a siliceous film. This siliceous film was observed under SEM by the method as described in the same section. As a result, it was found that the baked film was fully embedded in the inside of the grooves, and voids and the like were not observed. Further, neither void nor separation was observed between the film and the liner. The film thickness etched by aqueous washing solutions (1) and (2) {(a-b) and c} was measured and calculated. As a result, it was found that, regarding aqueous washing solution (1), for all the groove widths, the etched film thickness was substantially 0 angstrom, and, regarding aqueous washing solution (2), the etched film thickness was 0 to 20 angstroms, that is, the film was not substantially etched.

COMPARATIVE EXAMPLE 2

A solution was prepared in the same manner as in Example 3, except that tris(trimethylsilyl) phosphate was not added. The filtration of the solution, coating of the filtrate, and the heat treatment of the coating were carried out in the same manner as in Example 3, except that, after coating, the step of subjecting the coating film to moisture absorption by a humidifier in a humidified atmosphere under conditions of 50° C. and 80% RH for one hr was additionally provided. Thereafter, the step of baking was carried out in the same manner as in Example 3 to prepare a baked siliceous film.

The film thus obtained was evaluated. As a result, it was found that the specific permittivity was 2.20 and the density was 1.0 g/cm$^3$. The film was allowed to stand in the atmosphere under conditions of temperature 23° C. and relative humidity 50% for one week. Thereafter, the specific permittivity was again measured and was found to be 2.22. That is, the specific permittivity was increased only by 0.02.

Next, in the same manner as described in the section of (Evaluation on resistance to various aqueous washing solutions), the above filtrate was coated on the substrate having grooves on its surface, and the coating was heated by the above method to form a siliceous film. This siliceous film was observed under SEM by the method as described in the same section. As a result, it was found that the baked film was fully embedded in the inside of the grooves, and voids and the like were not observed. Further, neither void nor separation was observed between the film and the liner.

COMPARATIVE EXAMPLE 3

A solution was prepared in the same manner as in Example 1, except that tris(trimethylsilyl) phosphate was not added. In the same manner as in Example 1, the solution was filtered, and the filtrate was coated. Thereafter, without the humidification treatment, the coating was immediately heated in the atmosphere on a hot plate at 150° C. and then at 250° C. each for 3 min. This film was baked in a dry nitrogen atmosphere at 500° C. for 30 min. As a result, the film has many defects, suggesting that, during baking, the coating component in the solution was scattered without causing conversion and crosslinking reaction. Further, the film thickness was only about one-third of the baked film formed in the Example 1. IR spectrum showed that, in addition to the spectrum of Example 1, many peaks derived from Si—N existed at wavenumbers ($cm^{-1}$) 900 to 1000, and that broad absorption attributable to Si—OH existed at wavenumbers ($cm^{-1}$) around 920 and 3700. The specific permittivity of the resultant film was 3.85 as measured immediately after baking, whereas, after standing in the atmosphere (25° C., relative humidity 40%) for 3 hr, the specific permittivity exceeded 4.2, suggesting the progress of moisture absorption in the film.

From the above Comparative Example, it was confirmed that the addition of the phosphorus compound according to the present invention does not adversely affect the permittivity and embedding property of the baked siliceous film. Specifically, the specific permittivity of the siliceous film prepared in Comparative Example 1 was 2.90 (2.95 after standing), whereas the specific permittivity of the siliceous film prepared in Example 1 was 3.20 (3.30 after standing. It is apparent that, although the incorporation of phosphorus somewhat increased the specific permittivity, this level of specific permittivity difference is attributable to the contribution of the phosphoric acid component per se and the phosphoric acid component does not induce moisture absorption. This is true of comparison of Example 3 with Comparative Example 2.

Regarding the absolute value of the specific permittivity, even the maximum value was 3.50 (after standing) (Example 2). On the other hand, the specific permittivity of PMD in a PSG or BPSG system by the conventional CVD is not less than 4.2, demonstrating that the present invention can provide PMD having a significantly low specific permittivity.

Further, Comparative Example 3 demonstrated that the addition of the phosphorus compound according to the present invention can eliminate the need to provide the step of humidification in the conversion of the polyalkylsilazane to the siliceous film.

What is claimed is:

1. A phosphorus-containing silazane composition comprising a polyalkylsilazane and at least one phosphorus compound in an organic solvent wherein said phosphorus compound is tris(trimethylsilyl)phosphate.

2. A semiconductor device comprising a phosphorus-containing siliceous film comprising 0.5 to 10 atomic % of phosphorus and being produced by baking a film of a phosphorus-containing silazane composition comprising a polyalkylsilazane and at least one phosphorus compound in an organic solvent wherein said phosphorus compound is tris(trimethylsilyl)phosphate as an interlayer insulation film.

* * * * *